(12) United States Patent
Hashimoto

(10) Patent No.: US 6,798,058 B1
(45) Date of Patent: Sep. 28, 2004

(54) SEMICONDUCTOR DEVICE, MOUNTING AND METHOD OF MANUFACTURING MOUNTING SUBSTRATE, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/673,208

(22) PCT Filed: Feb. 17, 2000

(86) PCT No.: PCT/JP00/00894

§ 371 (c)(1),
(2), (4) Date: Oct. 13, 2000

(87) PCT Pub. No.: WO00/49655

PCT Pub. Date: Aug. 24, 2000

(30) Foreign Application Priority Data

Feb. 18, 1999 (JP) .......................... 11-039623

(51) Int. Cl.$^7$ ............................. H01L 23/48
(52) U.S. Cl. ........................................ 257/693
(58) Field of Search .................. 257/678, 693, 257/774, 778; 438/111, 121, 123; 29/827; 361/820, 728, 764; 174/52.1, 52.2, 262, 266, 267

(56) References Cited

U.S. PATENT DOCUMENTS 5,949,142 A 9/1999 Otsuka

FOREIGN PATENT DOCUMENTS

| EP | 801656 | * 10/1997 |
|---|---|---|
| EP | 0 810 656 A2 | 12/1997 |
| EP | 0 849 983 A1 | 6/1998 |
| JP | A 60-244094 | 12/1985 |
| JP | 60-244094 | 12/1985 |
| JP | A 1-061986 | 3/1989 |
| JP | 64-61986 | 3/1989 |
| JP | A 2-120093 | 5/1990 |
| JP | A 2-232393 | 9/1990 |
| JP | 09-260536 | 10/1997 |
| JP | A 9-307050 | 11/1997 |
| JP | 10-223696 | 8/1998 |
| JP | 10-270624 | 10/1998 |
| JP | 11-40620 | 2/1999 |
| JP | A 11-040620 | 2/1999 |
| JP | 11040620 | * 2/1999 |
| JP | 2-232393 | 12/1999 |

* cited by examiner

Primary Examiner—David A. Zarneke
(74) Attorney, Agent, or Firm—Oliff & Berridge, PLC

(57) ABSTRACT

There is provided a semiconductor device comprising: a first plating layer formed on one surface of an interconnect pattern; a second plating layer formed within through holes in the interconnect pattern; a semiconductor chip electrically connected to the first plating layer; an anisotropic conductive material provided on the first plating layer; and a conductive material provided on the second plating layer, wherein the first plating layer has appropriate adhesion properties with the anisotropic conductive material, and the second plating layer has appropriate adhesion properties with the conductive material.

27 Claims, 12 Drawing Sheets

SEMICONDUCTOR DEVICE, MOUNTING AND METHOD OF MANUFACTURING MOUNTING SUBSTRATE, CIRCUIT BOARD, AND ELECTRONIC INSTRUMENT

TECHNICAL FIELD

The present invention relates to a semiconductor device, a mounting substrate and method of manufacturing the mounting substrate, a circuit board, and an electronic instrument.

BACKGROUND ART

Semiconductor devices such as T-CSP (Tape-Chip Scale/Size Package) are known, which use a substrate on which an interconnect pattern is formed. Commonly, a semiconductor chip is mounted on the substrate, and with the electrodes of the semiconductor chip electrically connected to the interconnect pattern, solder balls are provided. The characteristics required of the surface of the interconnect pattern for connecting the electrodes of the semiconductor chip and the characteristics required for providing the solder balls are different. Although the surface of the interconnect pattern requires locally varying characteristics, conventionally the whole of the surface of the interconnect pattern has been subjected to a single plating operation.

DISCLOSURE OF THE INVENTION

The present invention solves the above described problem, and has as its objective the provision of a semiconductor device including an interconnect pattern having portions of its surface with different properties, and similarly a mounting substrate and method of manufacture thereof, a circuit board, and an electronic instrument.

(1) A semiconductor device of the present invention comprises:

a substrate in which a plurality of through holes are formed;

an interconnect pattern formed on the substrate and passing over the through holes;

a first plating layer formed on the interconnect pattern surface opposite to the substrate;

a second plating layer formed on the interconnect pattern surface looking toward the substrate in the through holes;

a semiconductor chip mounted on the substrate and electrically connected to the first plating layer;

a resin provided on the first plating layer; and a conductive material provided on the second plating layer, wherein the first and second plating layers have different properties.

According to the present invention, since the first and second plating layers are formed on the interconnect pattern, oxidation of the surface of the interconnect pattern can be prevented, and also the electrical contact resistance can be lowered.

The first and second plating layers have different characteristics. A plating layer having appropriate adhesion properties with a resin and a plating layer having appropriate adhesion with a conductive material commonly require different properties. The present invention provides for this by of the first and second plating layers of different properties.

(2) A semiconductor device of the present invention comprises:

a substrate;

a first interconnect pattern formed on one surface of the substrate;

a second interconnect pattern formed on the other surface of the substrate and electrically connected to the first interconnect pattern;

a first plating layer formed on the first interconnect pattern surface opposite to the substrate;

a second plating layer formed on the second interconnect pattern surface opposite to the substrate;

a semiconductor chip mounted on the substrate and electrically connected to the first plating layer;

a resin provided on the first plating layer; and a conductive material provided on the second plating layer, wherein the first and second plating layers have different properties.

According to the present invention, since the first and second plating layers are formed on the first and second interconnect patterns, oxidation of the surface of the first and second interconnect patterns can be prevented, and also electrical contact resistance can be lowered. The first and second plating layers have different characteristics. A plating layer having appropriate adhesion properties with a resin and a plating layer having appropriate adhesion with a conductive material commonly require different properties. The present invention provides for this by means of the first and second plating layers of different properties.

(3) A semiconductor device of the present invention comprises:

a substrate;

an interconnect pattern formed on the substrate;

a first plating layer formed on a first portion of the interconnect pattern surface opposite to the substrate;

a second plating layer formed on a second portion of the interconnect pattern surface opposite to the substrate;

a resin provided on the first plating layers;

a conductive material provided on the second plating layer; and a semiconductor chip mounted on the substrate and electrically connected to the conductive material, wherein the first and second plating layers have different properties.

According to the present invention, since the first and second plating layers are formed on the interconnect pattern, oxidation of the surface of the interconnect pattern can be prevented, and the electrical contact resistance can be lowered. The first and second plating layers have different characteristics. A plating layer having appropriate adhesion properties with a resin, and a plating layer having appropriate adhesion with a conductive material commonly require different properties. The present invention provides for this by means of the first and second plating layers of different properties.

(4) In this semiconductor device, the first plating layer may be formed to be thinner than the second plating layer.

By making the plating layer thinner, the adhesion properties with the resin are improved, and if the plating layer is made thicker, excellent bonding with the conductive material is obtained.

(5) in this semiconductor device, the first and second plating layers may be formed of different materials.

The first plating layer can be formed of a material improving the adhesion properties with a resin, and the second plating layer can be formed of a material having excellent bonding with the conductive material.

(6) In this semiconductor device, the resin may be an adhesive, and include conductive particles to constitute an anisotropic conductive material; and the semiconductor chip may be mounted by face-down bonding with the anisotropic conductive material interposed.

According to this, an anisotropic conductive material is provided on the first plating layer, and the first plating layer has appropriate adhesion properties with the adhesive of the anisotropic conductive material. By the formation of th first plating layer, in the face-down bonding of the semiconductor chip, the electrical contact resistance is lowered.

(7) A mounting substrate of the present invention comprises:

a substrate in which a plurality of through holes are formed;

an interconnect pattern formed on the substrate and passing ever the through holes;

a first plating layer formed on the interconnect pattern surface opposite to the substrate; and a second plating layer formed on the interconnect pattern surface looking toward the substrate in the through holes, wherein the first and second plating layers have different properties.

According to the prevent invention, since the first and second plating layers are formed on the interconnect pattern, oxidation of the surface of the interconnect pattern can be prevented, and also the electrical contact resistance can be lowered. The first and second plating layers have different characteristics. A plating layer having appropriate adhesion properties with a resin, and a plating layer having appropriate adhesion with a conductive material commonly require different properties. The present invention provides for this by means of the first and second plating layers of different properties.

(8) A mounting substrate of the present invention comprises:

a substrate;

a first interconnect pattern formed on one surface of the substrate;

a second interconnect pattern formed on the other surface of the substrate and electrically connected to the first interconnect pattern;

a first plating layer formed on the first interconnect pattern surface opposite to the substrate; and a second plating layer formed on the second interconnect pattern surface opposite to the substrate, wherein the first and second plating layers have different properties.

According to the present invention, since the first and second plating layers are formed on the first and second interconnect patterns, oxidation of the surface of the first and second interconnect patterns can be prevented, and also the electrical contact resistance can be lowered. The first and second plating layers have different characteristics. A plating layer having appropriate adhesion properties with a resin, and a plating layer having appropriate adhesion with a conductive material commonly require different properties. The present invention provides for this by means of the first and second plating layers of different properties.

(9) A mounting substrate of the present invention comprises:

a substrate;

an interconnect pattern formed on the substrate;

a first plating layer formed on a first portion of the interconnect pattern surface opposite to the substrate; and a second plating layer formed on a second portion of the interconnect pattern surface opposite to the substrate, wherein the first and second plating layers have different properties.

According to the present invention, since the first and second plating layers are formed on the interconnect pattern, oxidation of the surface of the interconnect pattern can be prevented, and also the electrical contact resistance can be lowered. The first and second plating layers have different characteristics. A plating layer having appropriate adhesion properties with a resin, and a plating layer having appropriate adhesion with a conductive material commonly require different properties. The present invention provides for this by means of the first and second plating layers of different properties.

(10) In this mounting substrate, the first plating layer may be formed to be thinner than the second plating layer.

By Making the plating layer thinner, the adhesion properties with the resin are improved, and if the plating layer is made thicker, excellent bonding with the conductive material is obtained.

(11) In this mounting substrate, the first and second plating layers may be formed of different materials.

The first plating layer can be formed of a material improving the adhesion properties with a resin, and the second plating layer can be formed or a material having excellent bonding with the conductive material.

(12) On a circuit board of the present invention, the above-described semiconductor device is mounted.

(13) An electronic instrument of the present invention is equipped with the above-described semiconductor device.

(14) A method of manufacturing a mounting substrate of the present invention comprises the steps of:

immersing a substrate in a plating bath, the substrate having a plurality of through holes and an interconnect pattern formed thereon and passing over the through holes;

electrically connecting the interconnect pattern to a cathode;

disposing a first anode to face the surface of the substrate on which the interconnect pattern is formed;

disposing a second anode to face the surface of the substrate opposite to the interconnect pattern; and passing currents of different current densities between the first and second anodes and the cathode, wherein a first plating layer is formed on the interconnect pattern by the current from the first anode; and wherein a second plating layer is formed on the interconnect pattern on the side of the substrate and within the through holes by the current from the second anode.

According to the present invention, a first plating layer can be formed on one surface of the interconnect pattern by the current from the first anode, and a second plating layer can be formed on the other surface of the interconnect pattern by the current from the second anode. It should be noted that the second plating layer is formed on the portion of the interconnect pattern exposed from the through holes.

(15) A method of manufacturing a mounting substrate of the present invention comprises the steps of:

immersing a substrate in a first plating bath, the substrate having a plurality of through holes and an interconnect pattern formed thereon and passing over the through holes;

electrically connecting the interconnect pattern to a cathode;

forming a first plating layer on the interconnect pattern by disposing a first anode to face the surface of the substrate on which the interconnect pattern is formed and carrying out electroplating;

immersing the substrate in a second plating bath;

electrically connecting the interconnect pattern to a cathode; and forming a second plating layer on the interconnect pattern surface looking toward the substrate in the through holes by disposing a second anode to face the surface of the substrate opposite to the interconnect pattern and carrying out electroplating.

According to the present invention, the substrate is immersed in first and second plating baths, and a first plating layer is formed on one surface of the interconnect pattern, and a second plating layer is formed on the other surface of the interconnect pattern.

(16) A method of manufacturing a mounting substrate of the present invention comprises the steps of:

forming a plurality of through holes and an interconnect pattern passing over the through holes on a substrate;

forming a first plating layer by covering the through holes with a first resist and applying electroless plating to the interconnect pattern; and forming a second plating layer by exposing a portion of the interconnect pattern in the through holes, covering the surface of the interconnect pattern opposite to the substrate with a second resist, and applying electroless plating to the interconnect pattern in the through holes.

According to the present invention, the first and second plating layers are formed by the two operations of electroless plating.

(17) A method of manufacturing a mounting substrate of the present invention comprises the steps of:

immersing a substrate in a plating bath, wherein the substrate has a first interconnect pattern formed on one surface and a second interconnect pattern electrically connected to the first interconnect pattern and formed on the other surfaces;

electrically connecting the first and second interconnect patterns to a cathode;

disposing a first anode to face the first interconnect pattern;

disposing a second anode to face the second interconnect pattern; and passing currents of different current densities between the first and second anodes and the cathode, wherein a first plating layer is formed on the first interconnect pattern by the current from the first anode; and wherein a second plating layer is formed on the second interconnect pattern by the current from the second anode.

According to the present invention, a first plating layer can be formed on the first interconnect pattern by the current from the first anode, and a second plating layer can be formed on the second interconnect pattern by the current from the second anode.

(18) A method of manufacturing a mounting substrate of the present invention comprises the steps of:

immersing a substrate in a first plating bath, wherein the substrate has a first interconnect pattern formed on one surface and a second interconnect pattern electrically connected to the first interconnect pattern and formed on the other surface;

electrically connecting the first interconnect pattern to a cathode;

forming a first plating layer on the first interconnect pattern, by disposing a first anode to face the first interconnect pattern and carrying out electroplating;

immersing the substrate in a second plating bath;

electrically connecting the second interconnect pattern to a cathode; and forming a second plating layer on the second interconnect pattern, by disposing a second anode to face the second interconnect pattern and carrying out electroplating.

According to the present invention, the substrate is immersed in first and second plating baths, a first plating layer is formed on the first interconnect pattern, and a second plating layer is formed on the second interconnect pattern.

(19) A method of manufacturing a mounting substrate of the present invention comprises the steps of:

forming a first interconnect pattern on one surface of a substrate;

forming a second interconnect pattern electrically connected to the first interconnect pattern on the other surface of the substrate;

forming a first plating layer by covering the second interconnect pattern with a first resist and applying electroless plating to the first interconnect pattern; and forming a second plating layer by covering the first interconnect pattern with a second resist and applying electroless plating to the second interconnect pattern.

According to the present invention, the first and second plating layers are formed by the two operations of electroless plating.

(20) A method of manufacturing a mounting substrate of the present invention comprises the steps of:

forming an interconnect pattern on a substrate;

forming a first plating layer on a first portion of the interconnect pattern by covering a second portion of the interconnect pattern with a resist and exposing the first portion, and applying electroless plating to the interconnect pattern; and forming a second plating layer in the second portion by covering the first portion with a resist and exposing the second portion, and applying electroless plating to the interconnect pattern.

According to the present invention, the first and second plating layers are formed by the two operations of electroless plating.

(21) In this method of manufacturing a mounting substrate, the first and second plating layers may have different properties.

A plating layer having appropriate adhesion properties with a resin, and a plating layer having appropriate adhesion with a conductive material commonly require different properties. In this case, by making the current densities between the first and second anodes and the cathode different, first and second plating layers of different thicknesses may be formed. Alternatively, by making the plating fluids in the first and second plating baths different, or making the current densities between the first and second anodes and the cathode different, first and second plating layers of different thicknesses may be formed.

(22) In this method of manufacturing a mounting substrate, the first plating layer may be formed to be thinner than the second plating layer.

By making the plating layer thinner, the adhesion properties with the resin are improved, and if the plating layer is made thicker, excellent bonding with the conductive material is obtained.

(23) In this method of manufacturing a mounting substrate, the first and second plating layers may be formed of different materials.

The first plating layer can be formed of a material improving the adhesion properties with a resin, and the second plating layer can be formed of a material having excellent bonding with the conductive material.

BEST MODE FOR CARRYING OUT THE INVENTION

The present intention is now described in the terms of a number of preferred embodiments, with reference to the drawings.

First Embodiment

Figure 1:
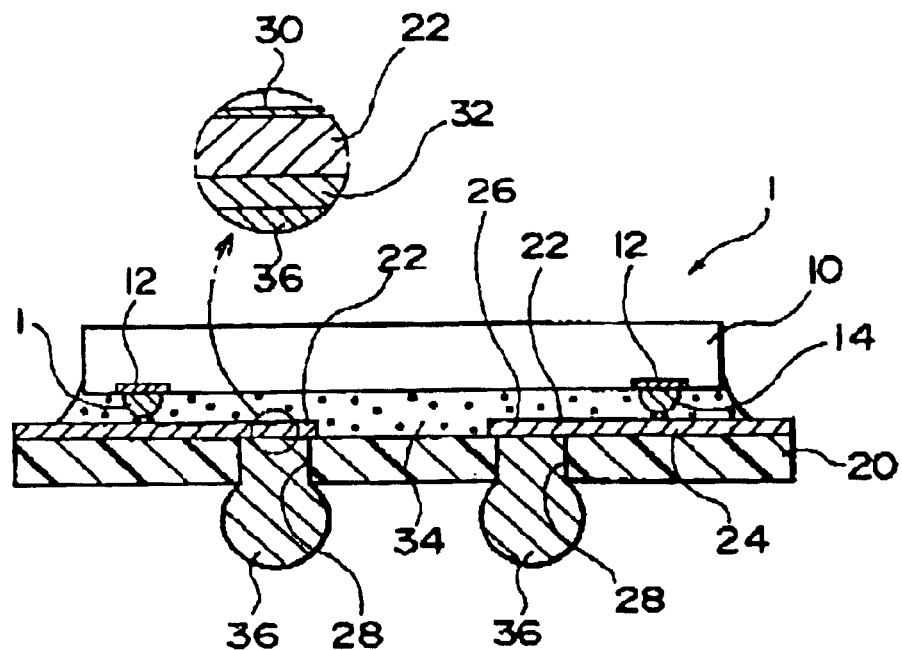
FIG. 1 shows a semiconductor device according to a first embodiment of the present invention.

FIG. 1 shows a first embodiment of the semiconductor device of the present invention. A semiconductor device 1 comprises a semiconductor chip 10 and a substrate 20. When the plan view form of the semiconductor chip 10 is a rectangle (a square or an oblong), along at least one side (which case includes a pair of opposing sides or all four sides), on one surface of the semiconductor chip 10 (the active surface) a plurality of electrodes 12 may be formed. Alternatively, the plurality of electrodes 12 may be arranged in the center of the semiconductor chip 10 or the vicinity thereof. On the electrodes 12 are provided bumps 14 in the form of solder balls, gold wire balls, gold plating, or the like. The electrodes 12 themselves may be in the form of bumps. Between the electrodes 12 and the bumps 14, a layer to prevent the diffusion of the bump metal, of nickel, chromium, titanium, or the like, may be applied.

There is no particular restriction on the overall form of the substrate 20, which may be a rectangle, polygon, or a combination of a plurality of rectangles, and can be a similar figure of the plan view form of the semiconductor chip 10. The thickness of the substrate 20 is commonly determined by the material used, and is not subject to particular restriction. The substrate 20 may be formed of an organic or inorganic material, or say be constituted of a combination thereof. The substrate 20 may be a flexible substrate, or may equally be a rigid substrate. The substrate 20 can be formed by punching out from a flexible substrate in the form of a tape formed of an organic resin.

Figure 2:
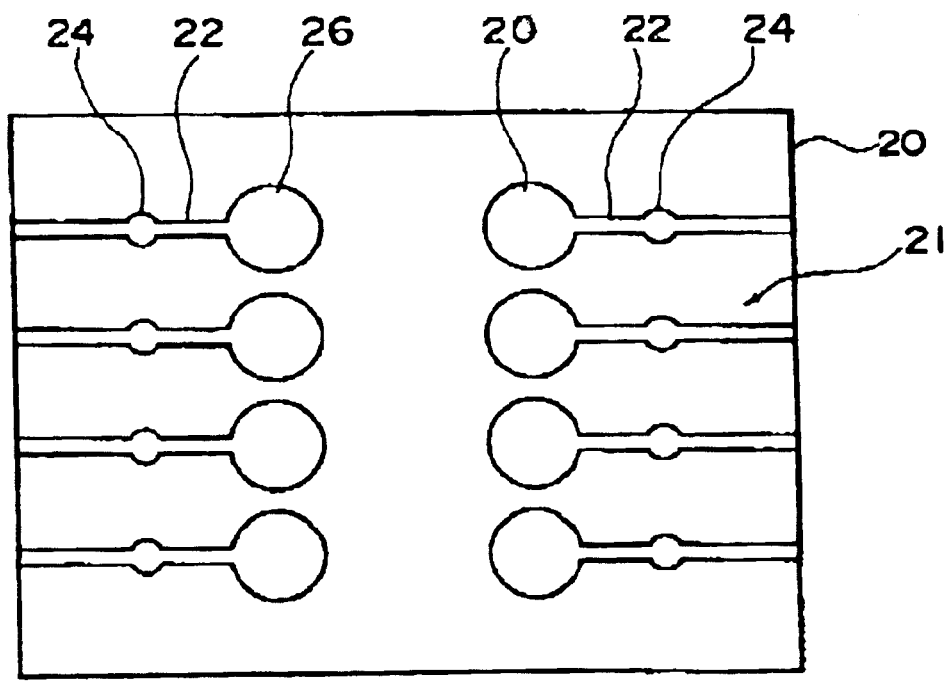
FIG. 2 shows a substrate of a semiconductor device according to the first embodiment of the present invention.

FIG. 2 is a plan view of the substrate of the semiconductor device shown in FIG. 1. As shown in FIGS. 1 and 2, on one surface of the substrate 20 is formed a plurality of interconnects (leads) 22, which constitute an interconnect pattern 21. Each of the interconnects 22 has formed lands 24 and 26. The lands 24 and 26 are commonly formed to be wider than the interconnect 22. The one land 26 may be formed in a position close to the center of the substrate 20, and the other land 24 formed at an intermediate point of the interconnect 22. Of the plurality of interconnects 22, at least one or all is or are not electrically conductive to the other interconnects 22, and is or are electrically isolated. Of the plurality of interconnects 22, interconnects such as those connected in common to the power supply or ground of the semiconductor chip 10 may have the lands 24 and 26 connected together.

In the substrate 20 is formed a plurality of through holes 28. Over each of the through holes 28 passes one of the interconnects 22. The ends of the interconnects 22 may equally be positioned over the through holes 28. When a land 26 is formed at the end of an interconnect 22, the land 26 is positioned over a through hole 28.

As shown in the enlargement in FIG. 1, the interconnects 22 have formed thereon first and second plating layers 30 and 32. The interconnects 22 are formed of copper, or a two-layer construction of platinum and nickel, and the material of the plating layers 30 and 32 can be selected from nickel, palladium, nickel-gold, nickel-palladium-gold, gold, solder, and tin. The first plating layer 30 is formed on the surface of the interconnect 22 opposite to that of the substrate 20. The second plating layer 32 is formed on the surface of the interconnect 22 facing the substrate 20 within the through hole 28. When a land 26 is positioned over the through hole 28, the second plating layer 32 is formed on the land 26. The first and second plating layers 30 and 32 have different properties as a result of differing in at least either of thickness or material.

The first plating layer 30 prevents oxidation at least over the land 24, and ensures conduction, and lowers the electrical contact resistance. Even though the first plating layer 30 is formed, intimate contact with the resin on the interconnects 22 can be obtained. For example, taking as an example of the resin an adhesive of an anisotropic conductive material, when nickel is formed as an underlayer for the plating layer 30, in order that for example a silane coupling material included in the adhesive forms a chemical compound with the nickel or with its oxide or hydroxide, the plating layer 30 is preferably formed to be thin. For example, gold plating of thickness on the order of 0.05 $\mu$m can be used for the first plating layer 30. This enables a strong bond to be obtained.

On the other hand, the second plating layer 32 is appropriate for bonding to a conductive material, such as for example external terminals. Far example, gold plating of thickness on the order of 0.3 μm as the second plating layer 32 ensures good bonding with the conductive material. If the conductive material is solder, solder plating may be used for the second plating layer 32 to ensure good soldering characteristics.

The semiconductor chip 10 is mounted on the substrate 20 by face-down bonding. The bumps 14 of the semiconductor chip 10, and the interconnects 22 formed on the substrate 20 are electrically connected. Since the plating layer 30 is formed on the interconnects 22 a satisfactory electrical connection is obtained. When the lands 24 and 26 are formed on the interconnects 22, the lands 24 and bumps 14 are electrically connected. As a means of the electrical connection may be used an anisotropic conductive material 34 including conductive particles in an adhesive formed of a resin. In this case, the conductive particles are interposed between the interconnects 22 and the bumps 14 to provide electrical conduction. The anisotropic conductive material 34 may be an anisotropic conductive film or anisotropic conductive adhesive.

When the anisotropic conductive material 34 is used, it covers the surface of the interconnects 22 opposite to the surface of contact with the substrate 20, the side surfaces and the end surfaces, or in other words the surfaces not in contact with the substrate 20. When the anisotropic conductive material 34 is not used, a resin of an underfill material or the like is employed to cover the surfaces of the interconnects 22 not in contact with the substrate 20. The material covering the interconnects 22 may also cover the whole of one surface of the substrate 20. Since the first plating layer 30 formed on the interconnects 22 has appropriate adhesion properties with the resin, the resin provided on the interconnects 22 is less liable to peel off. That is to say, the anisotropic conductive material 34 is made less liable to peel off.

On the surface of the interconnects 22 facing the substrate 20, within the through holes 28 a conductive material 36 is provided. In more detail, the conductive material 36 is ford on the second plating layer 32, and projects from the through holes 28. The conductive material 36 forms external terminals. Since the second plating layer 32 has appropriate adhesion properties with the conductive material, a sastisfactory electrical connection can be obtained between the conductive material 36 and the second plating layer 32. The conductive material 36 commonly consists of solder balls, but may equally be plating, or conductive projections of for example conductive resin.

Instead of the external terminals being formed by the conductive material 36, the through holes 28 may be filled with the conductive material 36, the second interconnects electrically connected to the conductive material 36 may be formed on the other surface of the substrate 20, and these second interconnects may be provided with external terminals. In this case, since the substrate 20 has interconnects formed on both surfaces it is a double-sided substrate. Furthermore, as the substrate 20 may equally be used a multi-layer substrate or a built-up substrate. When a built-up substrate or multi-layer substrate is used, if an interconnect pattern is formed on a solid ground layer which extends in plan view, then since a micro-strip construction with no surplus interconnect pattern is obtained, the signal transmission characteristics can be improved.

The above description applies to face-down bonding using the anisotropic conductive material 34, but there is no restriction to this method of face-down bonding, and the present invention can be applied to the method of applying heat (and if necessary, pressure) to a semiconductor chip with solder bumps, the method of applying heat and pressure (and if necessary ultrasound bonding) to a semiconductor chip with gold bumps, or the face-down bonding method using the setting shrinking force of a resin. This applies also to the following embodiments.

FIG. 1 is shown a fan-in type of semiconductor device in which the conductive material 36 forming the external terminals is provided only within the mounting region of the semiconductor chip 10, but this is not limitative of the invention. For example, the present invention can be applied to a fan-out type of semiconductor device in which external terminals are provided only outside the mounting region of the semiconductor chip 10, or a fan-in/fan-out type of semiconductor device in which this is combined with a fan-in type. In a fan-out type or fan-in/fan-out type of semiconductor device, by means of the resin provided on the interconnects 22, a stiffener may be adhered to the outside of the semiconductor chip. This applies also to the following embodiments.

Figure 3:
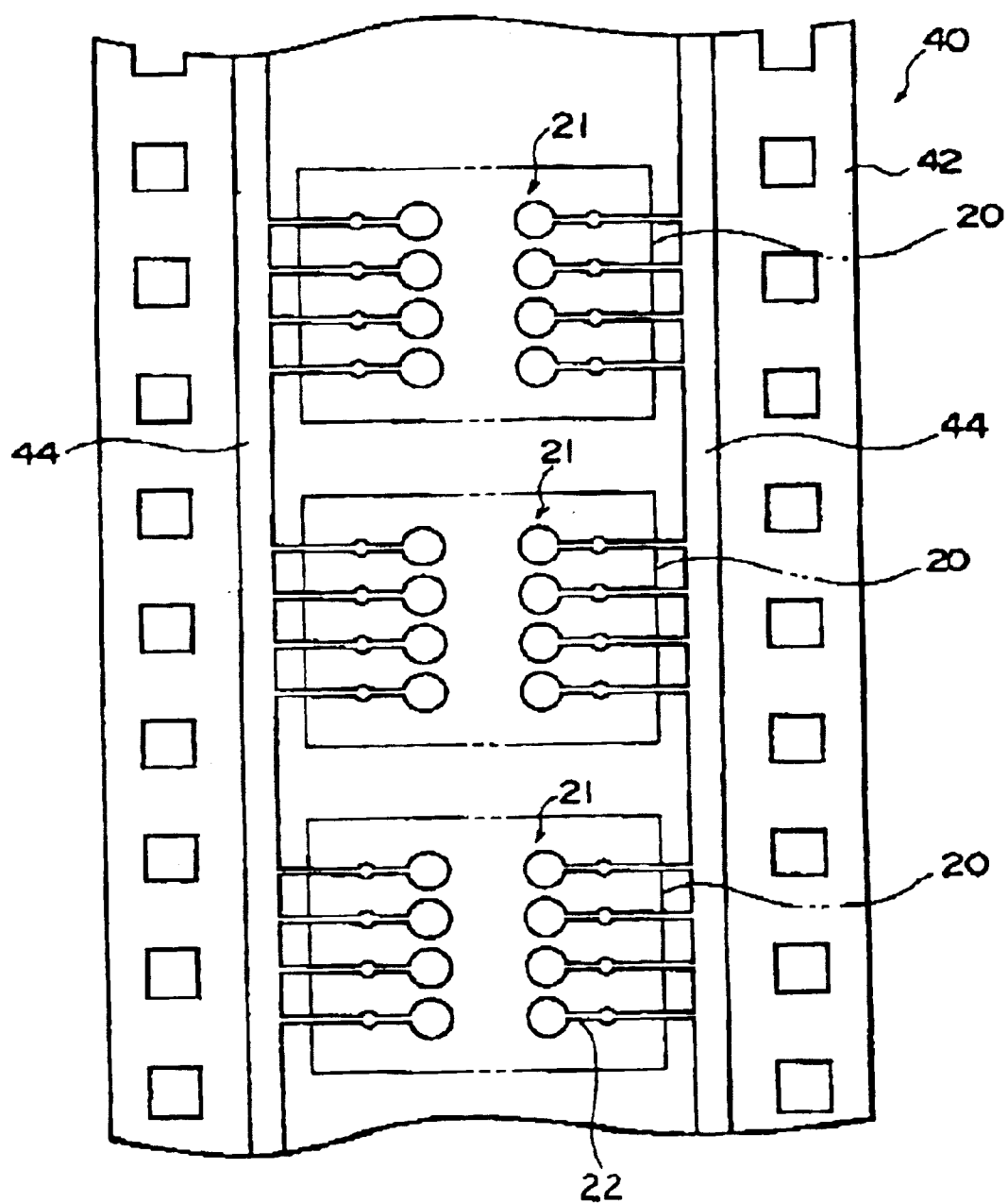
FIG. 3 shows a mounting substrate used in the first embodiment of the present invention.

FIG. 3 shows a mounting substrate of the first embodiment of the present invention. A mounting substrate 40 shown in FIG. 3 is a tape carrier, and has formed a plurality of interconnect patterns 21 (see FIG. 1) for a plurality of semiconductor devices. Each of the interconnect patterns 21 has formed first and second plating layers 30 and 32 (see FIG. 1). The tape carrier formed by the mounting substrate 40 is punched out to obtain mounting substrates corresponding to individual semiconductor devices. A substrate having at least one interconnect pattern 21 formed is a mounting substrate, and the substrate 20 with the interconnect pattern 21 shown in FIG. 1 formed is also a mounting substrate. Alternatively, as a finished product a mounting substrate larger than the outline of the semiconductor device may be provided. In this case, before the semiconductor chip is mounted, on a part and preferably at least half of the outline position of the semiconductor device, one or preferably a plurality of holes (for example slots) can be formed, and the remainder of the outline position (for example the portions between the plurality of holes) may be punched out after mounting the semiconductor chip.

The mounting substrate 40 shown in FIG. 3 includes a substrate 42 in which is formed a plurality of through holes 28 (see FIG. 1), a plurality of interconnect patterns 21 formed on the substrate 42, first and second plating layers 30 and 32 formed on the interconnects 22 constituting the interconnect pattern 21, and at least one plating lead 44. Portions indicated by the same reference numerals as in FIG. 1 are as described above, and further description is omitted here. The construction of a typical tape carrier can be applied to the mounting substrate 40.

The plating lead 44 is formed in a position outside the punching-out position, that is, the outline position of the substrate 20 of the completed semiconductor device. Therefore, when the mounting substrate 40 is punched out, the plating lead 44 can be removed. The interconnects 22 are electrically connected to the plating lead 44. As a result, using the plating lead 44, electroplating can be carried out on the interconects 22.

Figure 4:
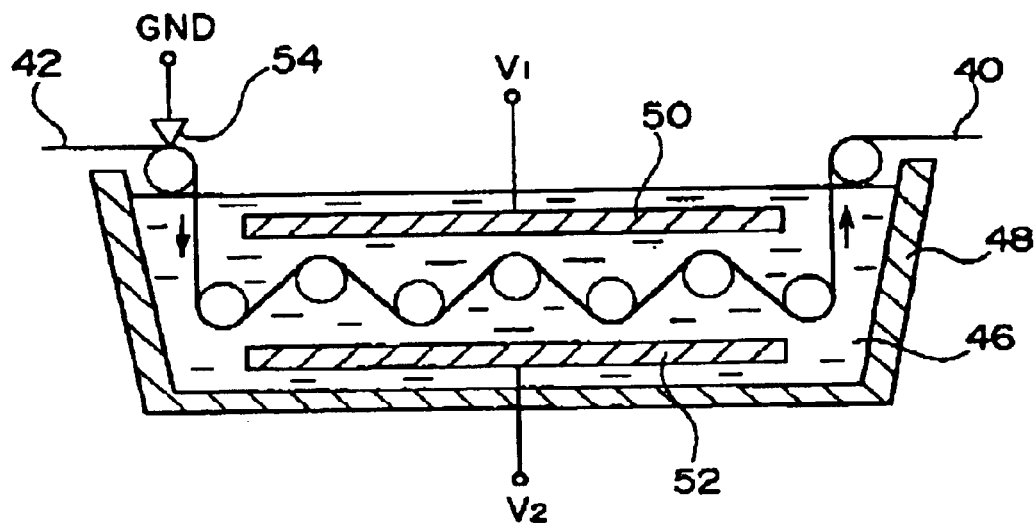
FIG. 4 shows a method of manufacturing a mounting substrate according to the first embodiment of the present invention.

Next, FIG. 4 shows a method of manufacturing this embodiment of the mounting substrate. First, the substrate 42 which constitutes the structure of the mounting substrate 40 from which the first and second plating layers 30 and 32 have been removed is obtained. In this state, on the substrate 42, at least one or a plurality of the interconnect patterns 21 and the plating lead 44 have been formed.

A plating vat 48 is filled with a plating fluid, to provide a plating bath 46. In the plating bath 46 are disposed first and second anodes 50 and 52, and the above described substrate 42 is passed therebetween. In more detail, one surface of the substrate 42 faces the first anode 50, and the other surface faces the second anode 52. It should be noted that if the substrate 42 is a tape, a reel-to-reel process can be applied.

When the plating lead 44 formed on the substrate 42 is connected to a cathode 54 to which a potential lower than that of the anodes 50 and 52 is applied, for example, a ground potential, then currents flow between the plating lead 44 and interconnect pattern 21 (interconnects 22) connected thereto, and each of the first and second anodes 50 and 52. In this way, electroplating is applied to the surface of the interconnect pattern 21 (interconnects 22) opposite to the substrate 42, and to the portions exposed by the through holes 28, and thus the first and second plating layers 30 and 32 can be formed.

By for example applying different voltages V1 and V2 to each of the first and second anodes 50 and 52, the current density of the current flowing from each thereof is arranged to be different. By means of this, the thicknesses of the first and second plating layers 30 and 32 can be made different.

In this way, the first and second plating layers 30 and 32 are formed on the interconnect pattern 21 (interconnets 22), and the mounting substrate 40 is obtained. It should be noted that if the substrate 42 is a tape, the mounting substrate 40 is a tape carrier.

Although not shown in the drawings, portions other than those forming electrical contacts may be covered by a permanent resist such as a solder resist, and this applies similarly to the following embodiments. In this case, plating is not applied to the portions other than those forming electrical contacts.

Next, the method of manufacturing a semiconductor device using this embodiment of the mounting substrate in described. On each of the interconnect patterns 21 formed on the above described mounting substrate 40 a semiconductor chip 10 in mounted by face-down bonding. For example, as shown in FIG. 1, the anisotropic conductive material 34 can be used. The anisotropic conductive material 34 may be provided beforehand on the surface of the semiconductor chip 10 on which the electrodes 12 are formed, or may be provided beforehand on the surface of the mounting substrate 40 on which the interconnects 22 are formed. The anisotropic conductive material 34 may be provided to cover each individual interconnect pattern 21 separately, or the anisotropic conductive material 34 may be provided to cover a plurality of interconnect patterns 21.

As shown in FIG. 1, the conductive material 36 forming the external terminals is provided. In this way, the plurality of semiconductor chips 10 is mounted on the mounting substrate 40, and a semiconductor device assembly consisting of the result of integrating the plurality of semiconductor devices 1 is obtained.

Figure 5:
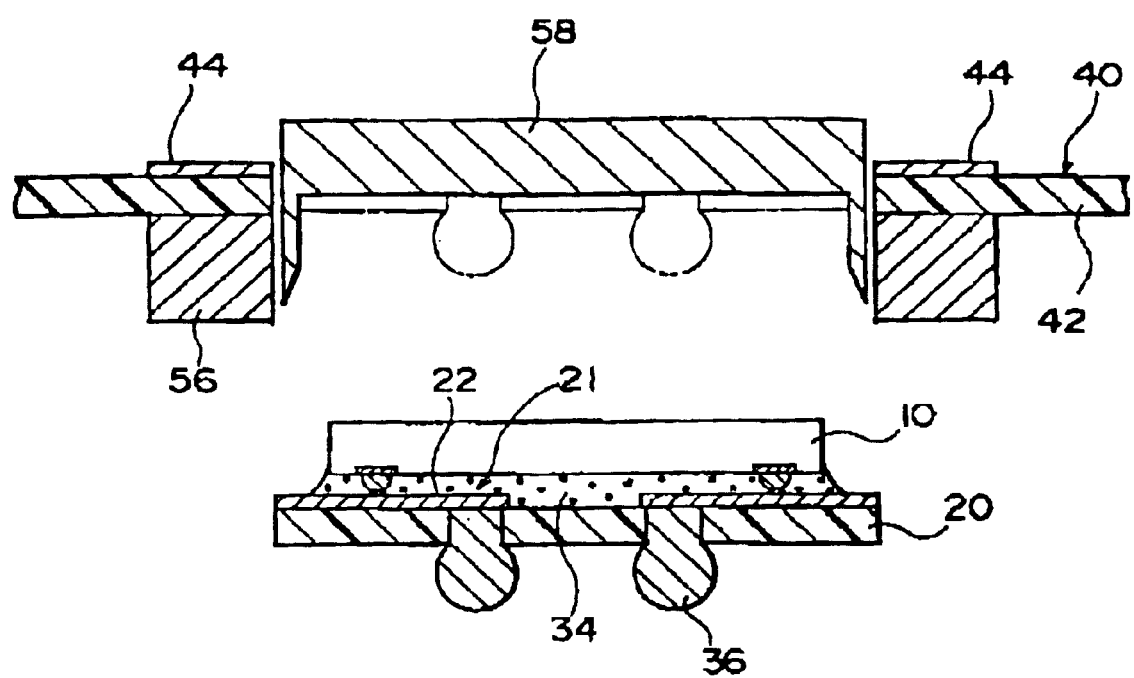
FIG. 5 shows a method of manufacturing a semiconductor device according to the first embodiment of the present invention.

Next, as shown in FIG. 5, the mounting substrate 40 is punched out on the outside of each semiconductor chip 10. The form in which the punching is carried out is not particularly restricted, but may be a shape similar to the plan view form of the semiconductor chip 10. For the punching out, cutting jigs 56 and 58 can be used. In this way, the semiconductor device 1 can be fabricated continuously.

Second Embodiment

Figure 6:
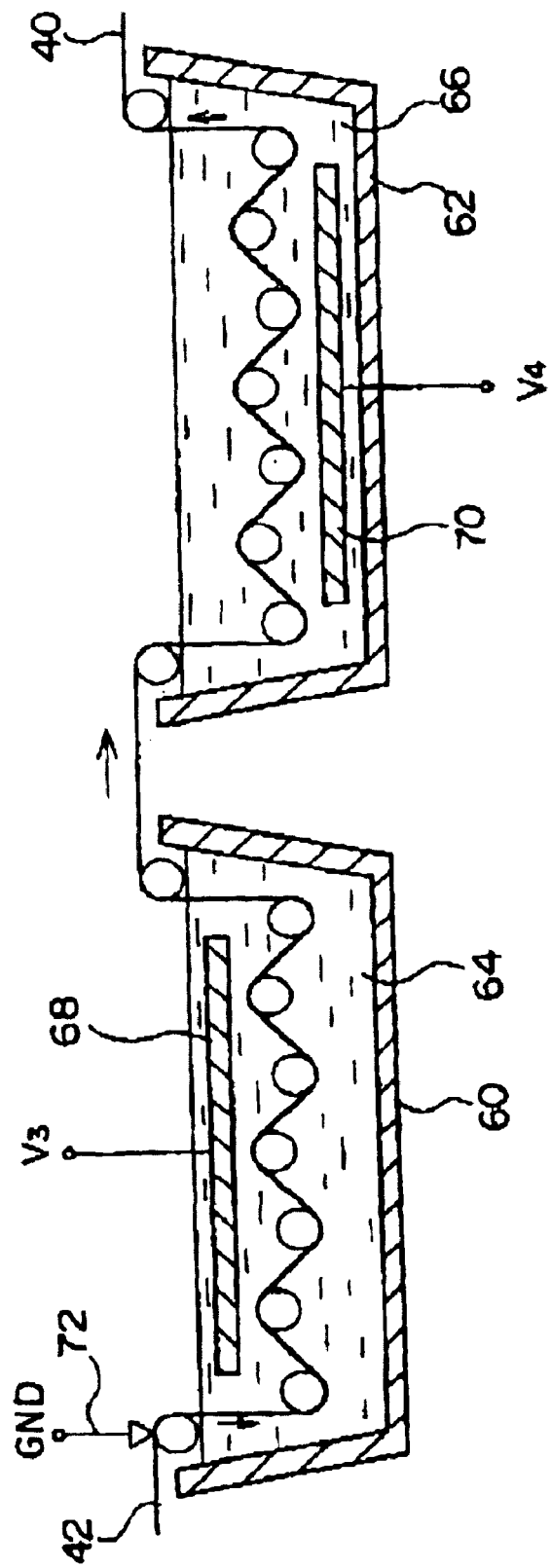
FIG. 6 shows a method of manufacturing a mounting substrate according to a second embodiment of the present invention.

FIG. 6 shows a method of manufacturing a second embodiment of the mounting substrate of the present invention. In this embodiment, the substrate 42 which constitutes the structure of the mounting substrate 40 shown in FIG. 3, from which the first and second plating layers 30 and 32 have been removed is obtained. In this state, on the substrate 42, at least one or a plurality of the interconnect patterns 21 and the plating lead 44 have been formed.

First and second plating vats 60 and 62 are filled with a plating fluid, to provide sequentially first and second plating bathe 64 and 66. In the first and second plating baths 64 and 66 are disposed first and second anodes 69 and 70. The substrate 42 is passed through the first plating bath 64 with one surface facing the first anode 68, and next is passed through the second plating bath 66 with the other surface facing the second anode 70. It should be noted that if the substrate 42 is a tape, a reel-to-reel process can be applied.

When the plating lead 44 formed on the substrate 42 is connected to a cathode 72 to which a potential lower than that of the anodes 69 and 70 is applied, for example, a ground potential, then currents flow between the plating lead 44 and interconnect pattern 21 (interconnects 22) connected thereto, and each of the first and second anodes 68 and 70. In this way, electroplating is applied to the surface of the interconnect pattern 21 (interconnect 22) opposite to the substrate 42, and to the portions exposed by the through holes 28, and thus the first and second plating layers 30 and 32 can be formed.

By for example applying different voltages V3 and V4 to each of the first and second anodes 68 and 70 the current density of the current flowing from each thereof is arranged to be different. By means of this, the thicknesses or the first and second plating layers 30 and 32 can be made different.

In this way, the first and second plating layers 30 and 32 are formed on the interconnect pattern 21 (interconnects 22), and the mounting substrate 40 shown in FIG. 3 is obtained. It should be noted that if the substrate 42 is a tape, the mounting substrate 40 is a tape carrier.

It should be noted that in this embodiment, the substrate 42 is consecutively immersed in the first and second plating baths 64 and 66, but this may equally be carried out in separate immersion processes. The first and second plating baths 64 and 66 are not restricted to containing the same metal ions, and may contain different metal ions. In that case, the material of the first and second plating layers 30 and 32 will be different. Furthermore, both the material and the thickness of the first and second plating layers 30 and 32 say be made different.

Third Embodiment

Figure 7A:
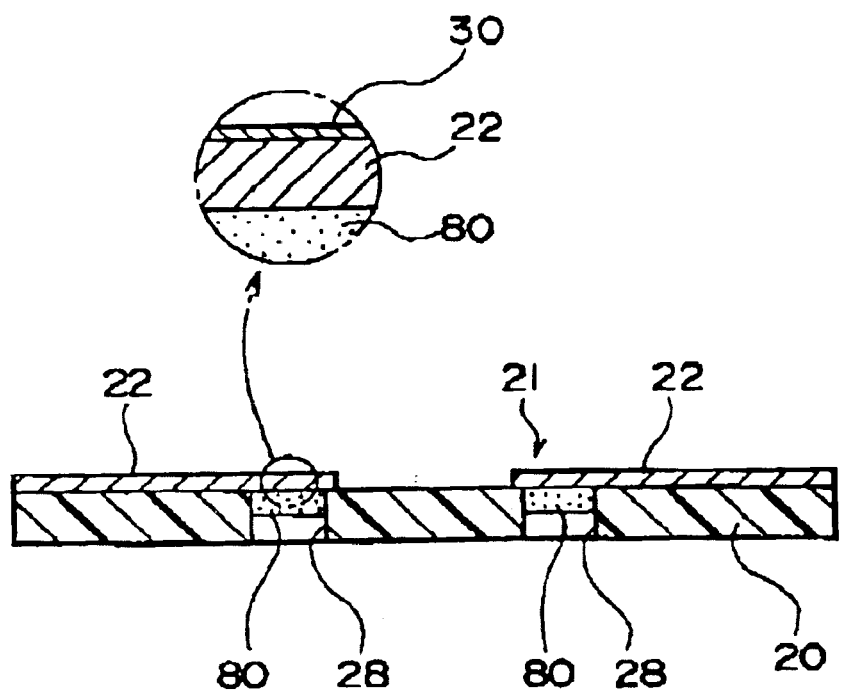
FIGS. 7A and 7B show a method of manufacturing a mounting substrate according to a third embodiment of the present invention.
Figure 7B:
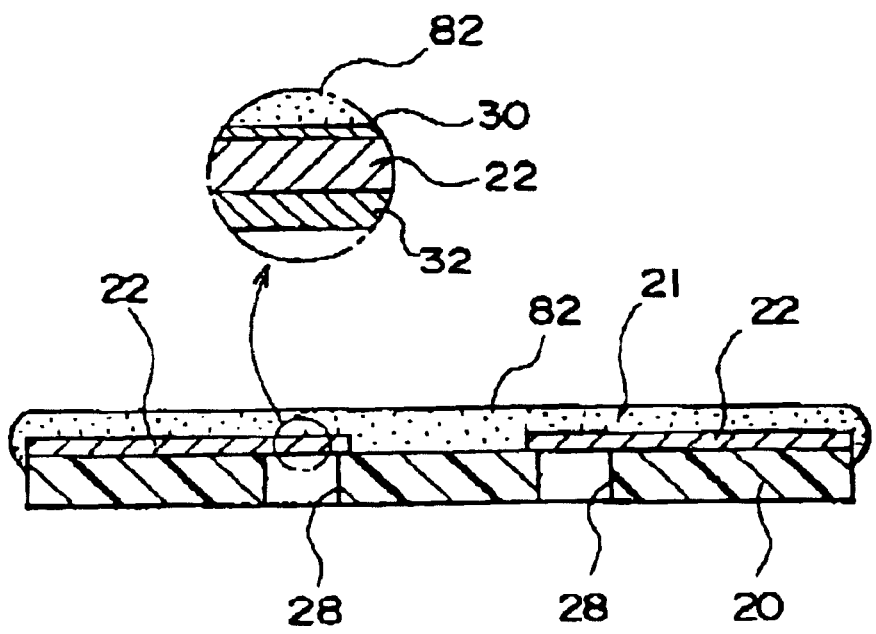

FIGS. 7A and 7B show a&method of manufacturing a third embodiment of the mounting substrate of the present invention. In this embodiment, the substrate 20 is obtained with the interconnect pattern 21 (interconnects 22) shown in FIG. 1 formed, but before the plating layers 30 and 32 have been formed.

First, as shown in FIG. 7A, the through holes 28 are filled with a resist 80. The resist 80 may be a resin, or it may be a removable tape or the like. By means of this, the part of the interconnects 22 exposed through the through holes 28 is covered. Then by applying electroless plating the exposed surface of the interconnects 22 is plated. The first plating layer 30 on the surface of the interconnects 22 opposite to that of the substrate 20 is formed. The first plating layer 30 has the properties as described in the first embodiment.

Next, the resist 80 is removed, and as shown in FIG. 7B, the portions of the interconnects 22 not covered by the resist 80 are covered by a resist 82. The resist 82 may be a resin, or may be a removable tape. Above the surface of the interconnects 22 opposite to the substrate 20 is covered by the resist 92, and within the through holes 28, a part of the interconnects 22 is exposed. The first plating layer 30 is covered by the resist 82. Then when the electroless plating in carried out, the exposed surface of the interconnects 22 is plated. On the portion of the interconnects 22 exposed within the through holes 28, the second plating layer 32 is formed. The second plating layer 32 has the properties as described in the first embodiment.

By means of the above process, as shown in FIG. 1, the substrate 20 having the first and second plating layers 30 and 32 formed on the interconnects 22 is obtained, and this forms the mounting substrate. In this embodiment, the order of forming the first and second plating layers 30 and 32 is not significant. In the electroless plating step, the same material may be used for the solution and first and second plating layers 30 and 32 formed with different thicknesses, or different materials may be used for the solution and first and second plating layers 30 and 32 formed of different materials. Further, both the material and thickness of the first and second plating layers 30 and 32 may be made different.

When at least the thicknesses of the first and second plating layers 30 and 32 are being varied, a double-sided plating layer may first be formed without applying a resist, then the resist applied to the layer opposite to the layer to be made thicker, and then further plating applied only to the layer to be made thicker, after which the resist is removed.

Fourth Embodiment

Figure 8:
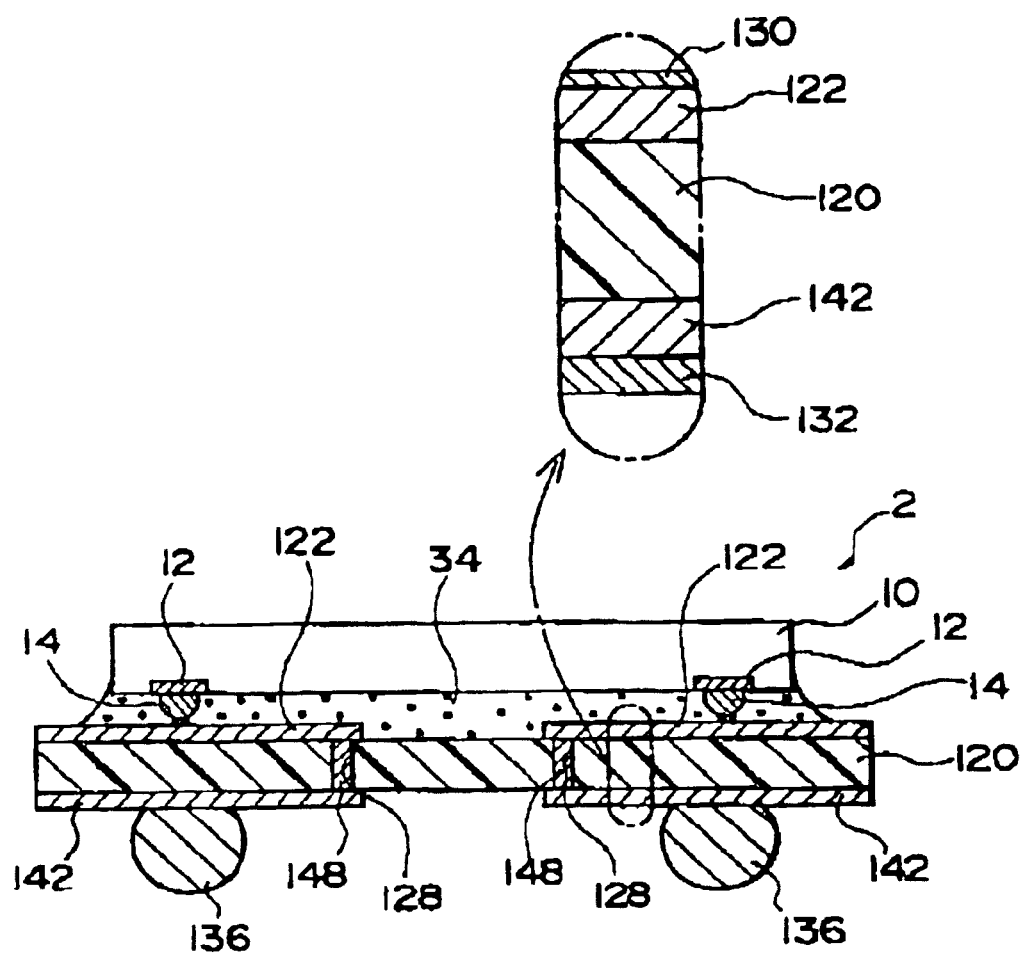
FIG. 8 shows a semiconductor device according to a fourth embodiment of the present invention.

FIG. 8 shows a fourth embodiment of the semiconductor device of the present invention. A semiconductor device 2 comprises a semiconductor chip 10 and a substrate 120. The semiconductor chip 10 is that described in the first embodiment, and has electrodes 12 and bumps 14. In the substrate 120 is formed a plurality of through holes 128, and in form, thickness, and substance these are the same as the substrate 20.

Figure 9A:
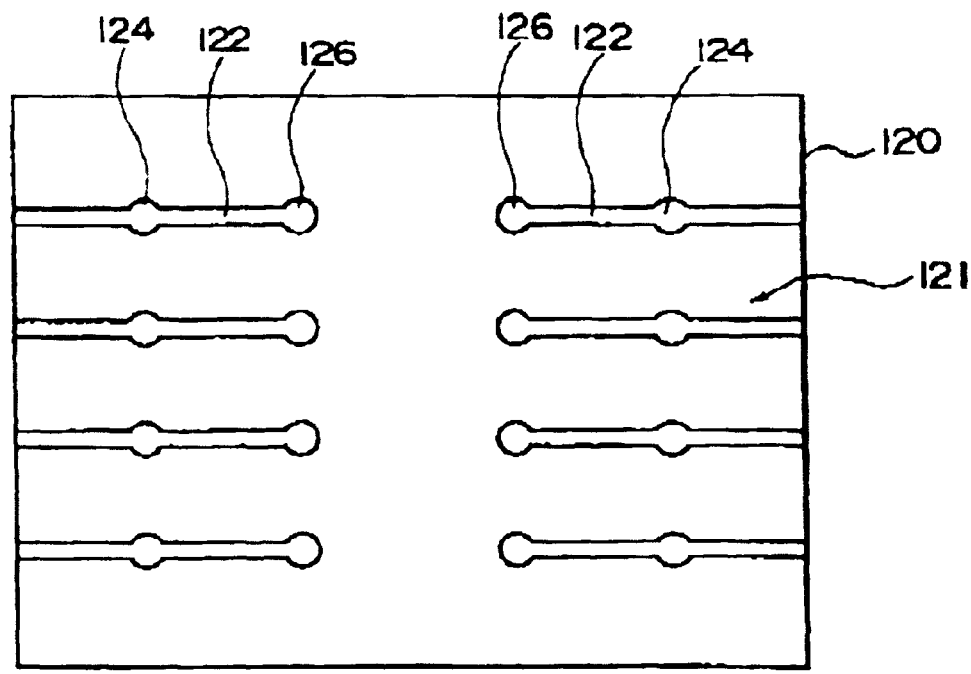
FIGS. 9A and 9B show a substrate of a semiconductor device according to the fourth embodiment of the present invention.
Figure 9B:
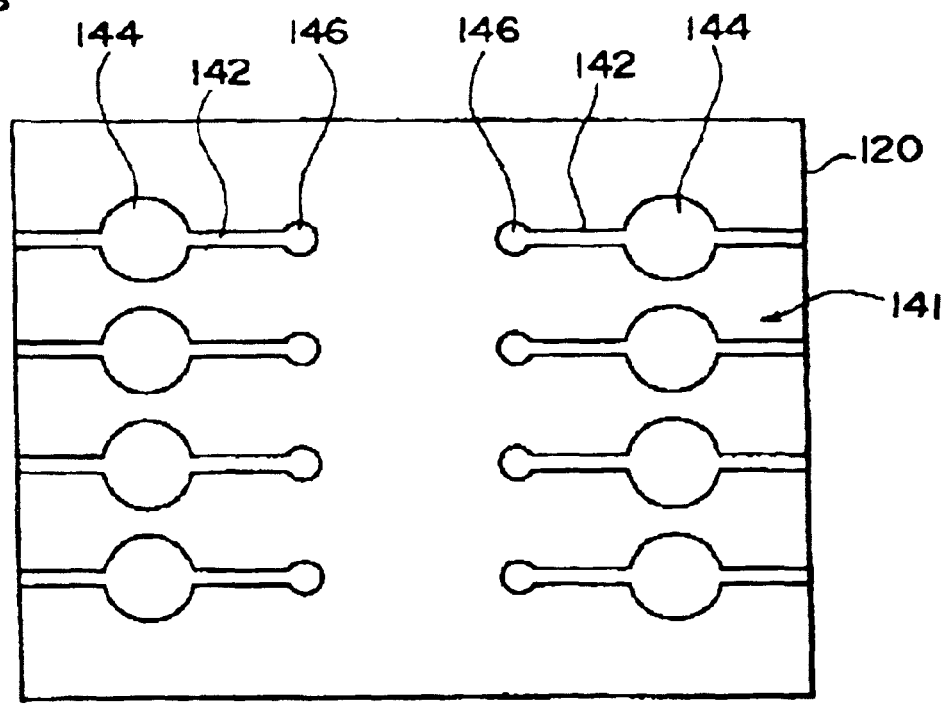

FIG. 9A is one plan view of the substrate of the semiconductor device shown in FIG. 8, and FIG. 9B is the other plan view. On one surface of the substrate 120 is formed a plurality of interconnects (leads) 122, constituting a first interconnect pattern 121. On each of the interconnects 122 are formed lands 124 and 126. The first interconnect pattern 121 may be the same as th interconnect pattern 21 described in the first embodiment. The land 126 shown in FIG. 9A has only to provide electrical conduction between the two sides of the substrate 120, and since no external terminals are provided, may be formed smaller than the land 26 in FIG. 1.

On the other surface of the substrate 120 is formed a plurality of interconnects (leads) 142, constituting a second interconnect pattern 141. On each of the interconnects 142 are formed lands 144 and 146. The second interconnect pattern 141 may be the same as the interconnect pattern 21 described in the first embodiment. In FIG. 9B the land 144 is formed larger, to provide for external terminals. The other land 146 has only to provide electrical conduction between the two sides of the substrate 120, and since no external terminals are provided, may be formed smaller than the land 144.

Over the plurality of through holes 128 formed on the substrate 120 pass a number of the interconnects 122 and 142 formed on each of the surfaces. The ends of the interconnects 122 and 142 may be positioned over the through holes 128. When the lands 126 and 146 are formed at the ends of the interconnects 122 and 142, the lands 126 and 146 are positioned over the through holes 128. The through holes 128 are provided with a conductive material 141, and the interconnects 122 on one surface of the substrate 120 and the interconnects 142 on the other surface are electrically connected.

It should be noted that holes communicating with the through holes 128 may be formed in a part of the interconnects 122 and 148 on both sides of the substrate 120, for example in the lands 126 and 146, and by plating or the like applied to the inner walls of these holes and the through holes 128 to provide a conductive material, the interconnects 122 and 148 on both sides of the substrate 120 may be made electrically conductive.

An shown in enlargement in FIG. 8, on the interconects 122 formed on one surface of the substrate 120 is formed a first plating layer 130, and on the interconnects 142 formed on the other surface of the substrate 120 is formed a second plating layer 132. The first and second plating layers 130 and 132 have different properties, by virtue of differing in at least either of thickness or material. The first plating layer 130 has the same properties as the first plating layer 30 described in the first embodiment, and the second plating layer 132 has the same properties as the second plating layer 32 described in the first embodiment. That is to say, the first plating layer 130 has good adhesion properties with resin, and the second plating layer 132 has appropriate adhesion properties with the conductive material.

The semiconductor chip 10 is mounted on the substrate 120 by face-down bonding. The bumps 14 of the semiconductor chip 10 and the interconnects 122 formed on one surface of the substrate 120 are electrically connected. Since the first plating layer 130 is formed on the interconnects 122, a satisfactory electrical connection is obtained. When the lands 124 and 126 are formed on the interconnects 122, the one set of lands 124 and the bumps 14 are electrically connected. As the means of electrical connection may be used the anisotropic conductive material 34 comprising conductive particles included in an adhesive formed of a resin. In this case, the conductive particles are interposed between the interconnects 122 and the bumps 14 and provide the electrical connection. The anisotropic conductive material 34 may be an anisotropic conductive film or an anisotropic conductive adhesive.

When the anisotropic conductive material 34 is used, portions of the interconnects 122 which are not in contact with the substrate 120 are covered by the anisotropic conductive material 34. When the anisotropic conductive material 34 is not used, the portions of the interconnects 122 which are not in contact with the substrate 120 are covered by a resin much as an underfill material. The material covering the interconnects 122 may cover the whole of one surface of the substrate 120. The first plating layer 130 formed on the interconnects 122 has good adhesion properties with resin, and therefore the resin provided over the interconnects 122 does not become detached easily.

On the interconnects 142 formed on the other side of the substrate 120 is provided a conductive material 136. In more detail, the conductive material 136 is formed on the second plating layer 132. The conductive material 136 constitutes external terminals. Since the second plating layer 132 has appropriate adhesion properties with the conductive material, a satisfactory electrical connection between the conductive material 136 and the second plating layer 132 is obtained. The conductive material 136 is commonly solder balls, but may equally comprise conductive projections such as plating, conductive resin, or the like.

At this time, other than the locations of formation of external terminals on the second plating layer 132 side may be covered by resist. In this way, for example when forming external terminals of solder, the solder does not wet and spread to other than the locations of forming the external terminals, and at least one of the height and positional accuracy of the external terminals can be maintained by the solder.

In FIG. 8, on both sides of the substrate 120, the first and second interconnect patterns 121 and 141 are formed, and by forming the first and second plating layers 130 and 132, the mounting substrate is obtained. An a method of manufacturing this mounting substrate the method shown in FIG. 4 can be applied. That is to say, one surface of the substrate 120 faces the first anode 50, and the other surface of the substrate 120 faces the second anode 52, and the method described in the first embodiment is applied, whereby the first and second plating layers 130 and 132 of different properties can be formed.

Alternatively, as a method of manufacturing this mounting substrate, the method shown in FIG. 6 can be applied. That is to say, one surface of the substrate 120 faces the first anode 68, and the other surface of the substrate 120 faces the second anode 70, and the method described in the second embodiment is applied, whereby the first and second plating layers 130 and 132 of different properties can be formed.

Alternatively, as a method of manufacturing this mounting substrate, the method shown in FIGS. 7A and 7B can be applied. That is to say, the first interconnect pattern 121 formed on one surface of the substrate 120 may be covered by a first resist and electroless plating carried out, then this resist removed, and the second interconnect pattern 141 formed on the other surface of the substrate 120 covered by a second resist and electroless plating carried out. In this case, the method described in the third embodiment is applied.

Fifth Embodiment

Figure 10:
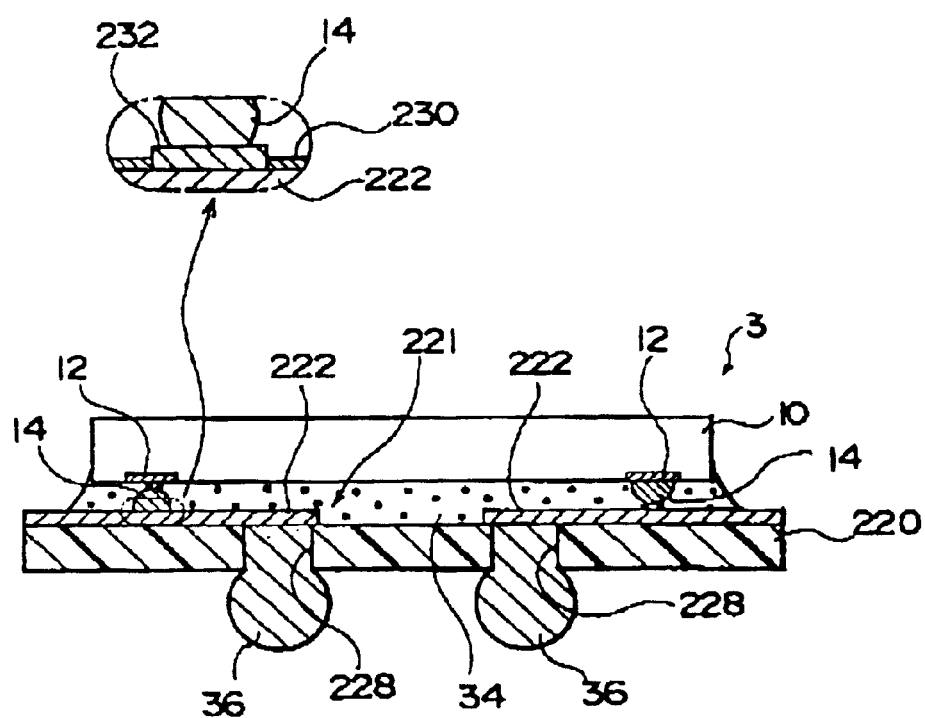
FIG. 10 shows a semiconductor device according to a fifth embodiment of the present invention.

FIG. 10 shows a fifth embodiment of the semiconductor device of the present invention. A semiconductor device 3 comprises a semiconductor chip 10 and a substrate 220. The semiconductor chip 10 is that described in the first embodiment, and has electrodes 12 and bumps 14. In the substrate 220 is formed a plurality of through holes 228, and in form, thickness, and substance theme are the same as the substrate 20. On the substrate 220 is formed a plurality of interconnects 22 constituting an interconnect pattern 221. The interconnect pattern 221 and interconnects 222 may have the same construction as the interconnect pattern 21 and interconnects 22 described in the first embodiment. The interconnects 222 pass over the through holes 228.

In this embodiment, as shown in enlargement in FIG. 10, first and second plating layers 230 and 232 are formed on the side of the interconnect pattern 222 opposite to the substrate 220. For other parts of the construction the same construction as is shown in the first embodiment can be applied, and parts or the same construction are also indicated by the same reference numerals in FIG. 10. Although not shown in FIG. 10, on exposed portions within the through holes 228 in the interconnects 222, to provide the conductive material 36 to form the external terminals, a plating layer having the same properties as the first plating layer 32 shown in FIG. 1 may be formed.

The first plating layer 230 has good adhesion properties with resin, and may have the same construction as the first plating layer 30 described in the first embodiment. The second plating layer 232 has appropriate adhesion properties with the conductive material, and may have the same construction as the second plating layer 32 described in the first embodiment.

The first plating layer 230 is formed in the portion (first portion) of the interconnect pattern 221 (interconnects 222) contacted by the resin, and is such as to render the resin provided thereon less liable to becoming detached. The adhesive of the anisotropic conductive material 34 is an example of the resin. The second plating layer 232 is formed in the portion (second portion) of the interconnect pattern 221 (interconnects 222) bonded to the bumps 14 as the conductive material, and provides a reliable electrical connection with the semiconductor chip 10.

On the substrate 220 shown in FIG. 10, the interconnect pattern 221 is formed, and the first and second plating layers 230 and 232 are formed, to obtain the mounting substrate.

Figure 11A:
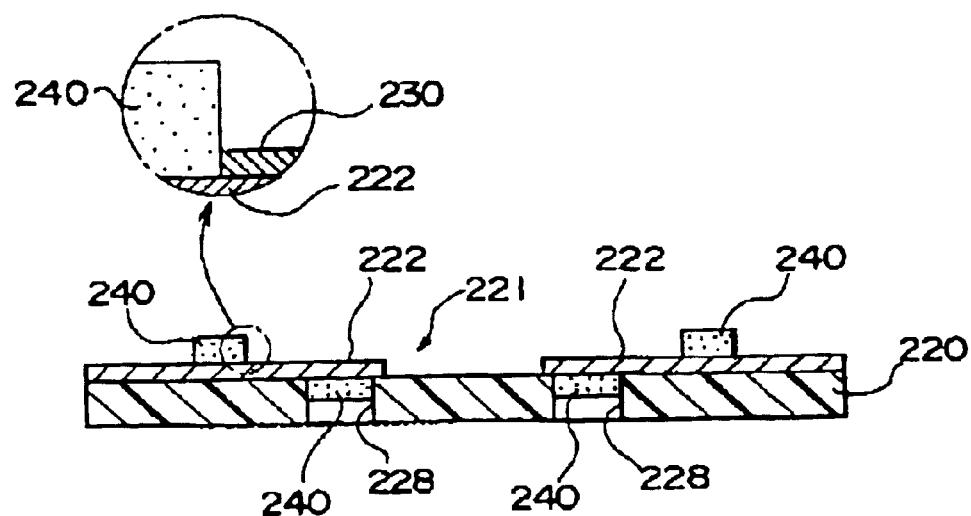
FIGS. 11A and 11B show a method of manufacturing a mounting substrate according to the fifth embodiment of the present invention.
Figure 11B:
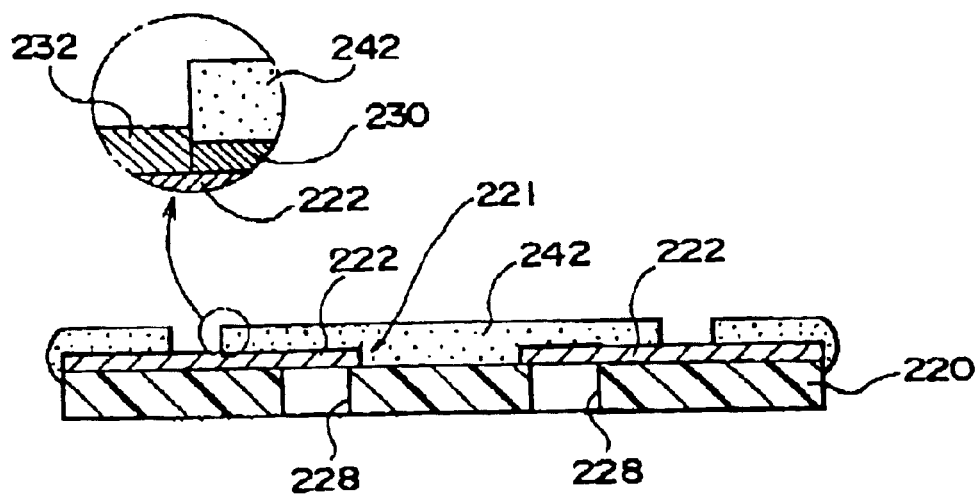

FIGS. 11A and 11B show a method of manufacturing the fifth embodiment of the mounting substrate of the present invention. In this embodiment, the substrate 220 is provided when the interconnect pattern 221 (interconnects 222) shown in FIG. 10 has been formed, and before the first and second plating layers 230 and 232 have been formed.

First, as shown in FIG. 11A, the portion (first portion) of the interconnect pattern 221 (interconnects 222) contacted by the resin is exposed, and on the interconnect pattern 221 (interconnects 222) a resist 240 is formed. The resist 240 is formed to exclude the portion (second portion) bonding with the conductive material. It should be noted that within the through holes 228 may also be filled with the resist 240. The resist 240 may b a resin, or may be a removable tape. Then when electroless plating is carried out, the exposed surface of the interconnects 222 is plated. For examples, the first plating layer 230 is formed on the surface of the interconnects 222 opposite to the substrate 20, in the portion (first portion) contacted by the resin.

Next, the resist 240 is removed, and as shown in FIG. 11B, the portion (first portion) of the interconnects 222 contacted by the resin is covered with a resist 242. The resist 242 may be a resin, or may be a removable tape. Within the through holes 228, a part of the interconnects 222 may be exposed. The first plating layer 230 is covered by the resist 242. When electroless plating is carried out, the exposed surface of the interconnects 222 is plated. On the portion (second portion) of the interconnects 222 bonding with the bumps 14 the second plating layer 232 is formed. The same plating layer may be formed on the exposed portion of the interconnects 222 within the through holes 228.

Plating can be carried out on the whole surface of the interconnect pattern 221, and after the portions other than those required, for example other than the second portion and within the through holes 228 have been covered with a resist, if further plating is carried out, plating of the necessary thickness and type can be applied to the necessary portions only.

By means of the above process, the first and second plating layers 230 and 232 are formed on the interconnects 222, and the substrate 220 is obtained, and this constitutes the mounting substrate. In this embodiment, the order of forming the first and second plating layers 230 and 232 is not significant. In the electroless plating step of forming the first and second plating layers 230 and 232, there is no restriction to the use of the same material for the solution, and different materials may be used for the solution. In this case the first and second plating layers 230 and 232 are formed of different materials. Further, both the material and thickness of the first and second plating layers 230 and 232 may be made different.

Figure 12:
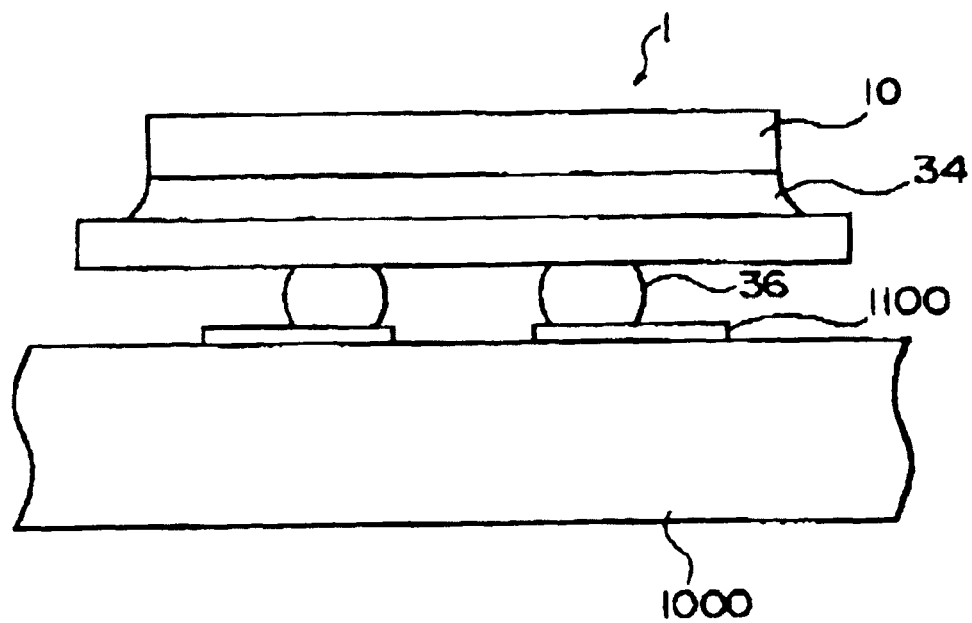
FIG. 12 shows a circuit board to which the present invention is applied.

In FIG. 12 is shown a circuit board 1000 on which is mounted this embodiment of the semiconductor device 1. For the circuit board 1000 is generally used an organic substrate such as a glass epoxy substrate or the like. On the circuit board 1000, an interconnect patterns 1100 of for example copper is formed to constitute a desired circuit, then by mechanical connection of this interconnect pattern and the external terminals 36 of the semiconductor device 1, electrical connection is achieved.

Figure 13:
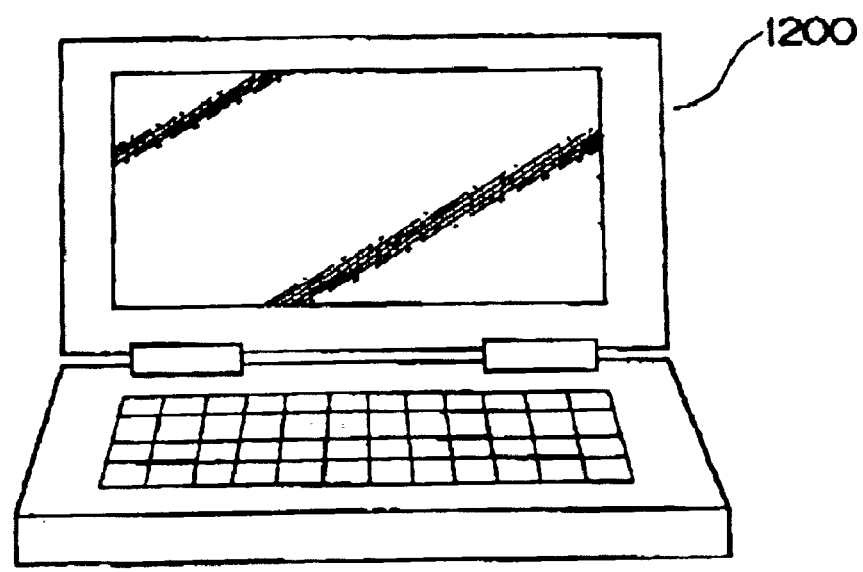
FIG. 13 shows an electronic instrument equipped with a semiconductor device fabricated with application of the method of the present invention.

Then as an electronic instrument 1200 equipped with the semiconductor device 1 to which the present invention is applied, in FIG. 13 is shown a notebook personal computer 1100.

It should be noted that the above-described "semiconductor element" that is structural component of the present invention may be replaced by "electronic element," and an electronic element (either an active element or a passive element) can be mounted on a substrate to fabricate an electronic component, in the same way as a semiconductor chip. As electronic components manufactured by using such an electronic element may be cited, for example, resistors, capacitors, coils, oscillators, filters, temperature sensors, thermistors, varistors, variable resistors, and fuses.

What is claimed is:

1. A semiconductor device, comprising:
   a substrate in which a plurality of through holes are formed;
   an interconnect pattern formed on the substrate and passing over the through holes;
   a first plating layer formed on the interconnect pattern surface opposite to the substrate;
   a second plating layer formed on the interconnect pattern surface looking toward the substrate in the through holes;
   a semiconductor chip mounted on the substrate and electrically connected to the first plating layer;
   a resin provided on the first plating layer; and
   a conductive material provided on the second plating layer,
   wherein the first plating layer is more appropriate for contact with the resin than the second plating layer, and the second plating layer is more appropriate for bonding to the conductive material than the first plating layer.

2. A semiconductor device, comprising:
   a substrate;
   a first interconnect pattern formed on one surface of the substrate;
   a second interconnect pattern formed on the other surface of the substrate and electrically connected to the first interconnect pattern;
   a first plating layer formed on the first interconnect pattern surface opposite to the substrate;
   a second plating layer formed on the second interconnect pattern surface opposite to the substrate;
   a semiconductor chip mounted on the substrate and electrically connected to the first plating layer;
   a resin provided on the first plating layer; and
   a conductive material provided on the second plating layer,
   wherein the first plating layer is more appropriate for contact with the resin than the second plating layer, and the second plating layer is more appropriate for bonding to the conductive material than the first plating layer.

3. A semiconductor device, comprising:
   a substrate;
   an interconnect pattern formed on the substrate;
   a first plating layer formed on a first portion of the interconnect pattern surface opposite to the substrate;
   a second plating layer formed on a second portion of the interconnect pattern surface opposite to the substrate;
   a resin provided on the first plating layer;
   a conductive material provided on the second plating layer; and
   a semiconductor chip mounted on the substrate and electrically connected to the conductive material,
   wherein the first plating layer is more appropriate for contact with the resin than the second plating layer, and the second plating layer is more appropriate for bonding to the conductive material than the first plating layer.

4. The semiconductor device as defined in claim 1, wherein the first plating layer is formed to be thinner than the second plating layer.

5. The semiconductor device as defined in claim 2, wherein the first plating layer is formed to be thinner than the second plating layer.

6. The semiconductor device as defined in claim 3, wherein the first plating layer is formed to be thinner than the second plating layer.

7. The semiconductor device as defined in claim 1, wherein the first and second plating layers are formed of different materials.

8. The semiconductor device as defined in claim 2, wherein the first and second plating layers are formed of different materials.

9. The semiconductor device as defined in claim 3, wherein the first and second plating layers are formed of different materials.

10. The semiconductor device as defined in claim 1, wherein the resin is an adhesive, and includes conductive particles to constitute an anisotropic conductive material; and
    wherein the semiconductor chip is mounted by face-down bonding with the anisotropic conductive material interposed.

11. The semiconductor device as defined in claim 2, wherein the resin is an adhesive, and includes conductive particles, to constitute an anisotropic conductive material; and
    wherein the semiconductor chip is mounted by face-down bonding with the anisotropic conductive material interposed.

12. The semiconductor device as defined in claim 3, wherein the resin is an adhesive, and includes conductive particles, to constitute an anisotropic conductive material; and
    wherein the semiconductor chip is mounted by face-down bonding with the anisotropic conductive material interposed.

13. A mounting substrate, comprising:
    a substrate in which a plurality of through holes are formed;
    an interconnect pattern formed on the substrate and passing over the through holes;
    a first plating layer formed on the interconnect pattern surface opposite to the substrate; and
    a second plating layer formed on the interconnect pattern surface looking toward the substrate in the through holes,
    wherein the first plating layer is more appropriate for contact with a resin than the second plating layer, and the second plating layer is more appropriate for bonding to a conductive material than the first plating layer.

14. A mounting substrate, comprising:

a substrate;

a first interconnect pattern formed on one surface of the substrate;

a second interconnect pattern formed on the other surface of the substrate and electrically connected to the first interconnect pattern;

a first plating layer formed on the first interconnect pattern surface opposite to the substrate; and a second plating layer formed on the second interconnect pattern surface opposite to the substrate, wherein the first plating layer is more appropriate for contact with a resin than the second plating layer, and the second plating layer is more appropriate for bonding to a conductive material than the first plating layer.

15. A mounting substrate, comprising:

a substrate;

an interconnect pattern formed on the substrate;

a first plating layer formed on a first portion of the interconnect pattern surface opposite to the substrate; and a second plating layer formed on a second portion of the interconnect pattern surface opposite to the substrate, wherein the first plating layer is more appropriate for contact with a resin than the second plating layer, and the second plating layer is more appropriate for bonding to a conductive material than the first plating layer.

16. The mounting substrate as defined in claim 13, wherein the first plating layer is formed to be thinner than the second plating layer.

17. The mounting substrate as defined in claim 14, wherein the first plating layer is formed to be thinner than the second plating layer.

18. The mounting substrate as defined in claim 15, wherein the first plating layer is formed to be thinner than the second plating layer.

19. The mounting substrate as defined in claim 13, wherein the first and second plating layers are formed of different materials.

20. The mounting substrate as defined in claim 14, wherein the first and second plating layers are formed of different materials.

21. The mounting substrate as defined in claim 15, wherein the first and second plating layers are formed of different materials.

22. A circuit board on which is mounted the semiconductor device as defined in claim 1.

23. A circuit board on which is mounted the semiconductor device as defined in claim 2.

24. A circuit board on which is mounted the semiconductor device as defined in claim 3.

25. An electronic instrument equipped with the semiconductor device as defined in claim 1.

26. An electronic instrument equipped with the semiconductor device as defined in claim 2.

27. An electronic instrument equipped with the semiconductor device as defined in claim 3.

* * * * *

UNITED STATES PATENT AND TRADEMARK OFFICE
CERTIFICATE OF CORRECTION

PATENT NO. : 6,798,058 B1
DATED : September 28, 2004
INVENTOR(S) : Nobuaki Hashimoto It is certified that error appears in the above-identified patent and that said Letters Patent is hereby corrected as shown below:

Title page,
Item [54], Title, should read -- SEMICONDUCTOR DEVICE, MOUNTING SUBSTRATE AND METHOD OF MANUFACTURING MOUNTING SUBSTRATE, CIRCUIT BOARD, AND ELECTRONIC INSTRUMENT --

Signed and Sealed this

Twelfth Day of April, 2005

JON W. DUDAS
*Director of the United States Patent and Trademark Office*